Sept. 12, 1967 P. LEFFERTS 3,341,712

CURRENT SENSING TIMING CIRCUITS

Filed Jan. 23, 1963 2 Sheets-Sheet 1

INVENTOR.
PETER LEFFERTS
BY Hurvitz & Rose
ATORNEYS

INVENTOR.
PETER LEFFERTS
BY Hurvitz & Rose
ATTORNEYS

United States Patent Office 3,341,712

Patented Sept. 12, 1967

3,341,712

CURRENT SENSING TIMING CIRCUITS

Peter Lefferts, Princeton, N.J., assignor to Fifth Dimension, Inc., Princeton, N.J., a corporation of New Jersey Filed Jan. 23, 1963, Ser. No. 253,495
7 Claims. (Cl. 307—88.5)

The present invention relates generally to a timing circuit and more particularly to a transistorized timing circuit which senses the displacement current through a timing capacitor to effect switching.

In the past, timing circuits have frequently taken the form of an R.C. integrating circuit having its input responsive to a rectangular wave form and its output connected between the base and emitter of a transistor switch. The circuit functions by charging a capacitor in the integrating circuit to a sufficient value to switch the transistor into a highly conductive state from its previously cut off state. The switching time is a function of the integrator R.C. time constant, the leakage characteristics of the transistor switch, the biasing voltage connected to the transistor emitter electrode, and the voltage difference between the base and emitter electrodes of the switching transistor.

The prior art circuit has not proven satisfactory in many instances, particularly with regard to transistor leakage. This problem is not obviated by including an isolating diode in the circuit because the junction drops of the diode and the emitter-base electrodes add, instead of subtract. This causes indefinite timing because the resultant fluctuations of the junction drops with temperature changes preclude the generation of a wave form which invariably repeats itself.

The present invention obviates this disadvantage of the integrating circuit by employing a resistance capacitance circuit arranged so that the switching transistor is responsive to the current flow through the capacitor, rather than the charge accumulated on it. This is accomplished by connecting one terminal of the capacitor to the transistor base and the other terminal of the capacitor to a current limiting resistor, responsive to the input voltage. The terminal between the capacitor and the current limiting resistor is connected to a biased diode which limits the maximum capacitor voltage, hence limits the capacitor charging and accompanying displacement current flow. To provide a load for the switching transistor input and a leakage return path to bias off the transistor, a resistance is connected between its base and emitter electrodes or between base and a bias point.

In response to a sudden voltage change, the flow of current through the load resistance jumps due to the negligible impedance of the capacitor to transients. As time progresses and the input voltage to the timing circuit is maintained at the same level, a charge is built up on the capacitor. This occurs until the sum of the voltages across the load resistance, which is mainly that of transistor base emitter junction drop, and the capacitor reaches the diode bias voltage. When this occurs, current flow through the capacitor ceases and the voltage between the switching transistor emitter and base drops to zero. Hence, the switching transistor is cut off and the resulting voltage change at its collector electrode output is delayed with respect to the forward edge of the original signal applied to the timing circuit.

The base load resistance may be excluded if desired. In such a case, the circuit functions is substantially the same manner but the capacitor current flow is coupled only through the base-emitter path of the switching transistor. Transistor cut-off occurs when the sum of the capacitor and the base-emitter drops equals the diode bias voltage due to the termination of base current.

The circuit of the present invention thus provides an output wave that changes in response to the leading edge of the input signal and reverts back to its original status at the expiration of the timing cycle. This is superior to the prior circuit, in which a change does not occur until the time duration has elapsed, since the transistor does not have to be externally clocked back to its original status to render it responsive to the leading edges of succeeding waves.

The circuit of the present invention may be utilized as a delay element having an extremely wide range, from zero to one or more seconds. To control the duration of the time delay effected by the circuit, it is merely necessary to vary the limiting voltage applied to the diode or to change the magnitude of the components in the R.C. timing circuit. If it is desired to effect extremely small time delays, a voltage drop diode is inserted in the input circuit of the switching transistor.

The concepts of the present invention have been found to be satisfactory for use in a voltage controlled oscillator having a square wave output; a pulse delay line employing one transistor per stage of delay, with the capability of different delay periods between stages; and a clock source admirably suited for deriving extremely low frequency or long period signals.

It is, accordingly, an object of the present invention to provide a new and improved timing network.

It is another object of the present invention to provide a new and improved timing network in which a switching element is responsive to the current displacement through a timing capacitor.

It is a further object of the present invention to provide a timing network wherein a switch is closed in response to an input wave and is opened at the expiration of the timing period.

It is an additional object of the present invention to provide a timing network which operates accurately with a charging current of only about twice the expected transistor leakage when ordinary diodes are utilized therein.

It is still another object of the present invention to provide a timing circuit in which an isolating diode may be advantageously used without causing variations in the wave shape applied to a transistor switching element resulting from addition of the diode and the transistor junction drops.

It is still a further object of the present invention to provide a delay network which is variable over wide limits, from zero to many seconds.

It is an additional object of the present invention to provide a voltage controlled multivibrator type oscillator employing in each stage a timing network responsive to current displacement through a capacitor.

Still a further object of the present invention is to provide a pulse delay line incorporating in each of its stages a delay element responsive to the current flow through a timing capacitor.

Yet another object of the present invention is to provide a low frequency extremely stable oscillator or clock source.

The above and still further objects, features and advantages of the present invention will become apparent upon consideration of the following detailed description of one specific embodiment thereof, especially when taken in conjunction with the accompanying drawings, wherein.

Figures 1, 2A, 2B, 2C, 2D, 2E, 2F, 3, 4:
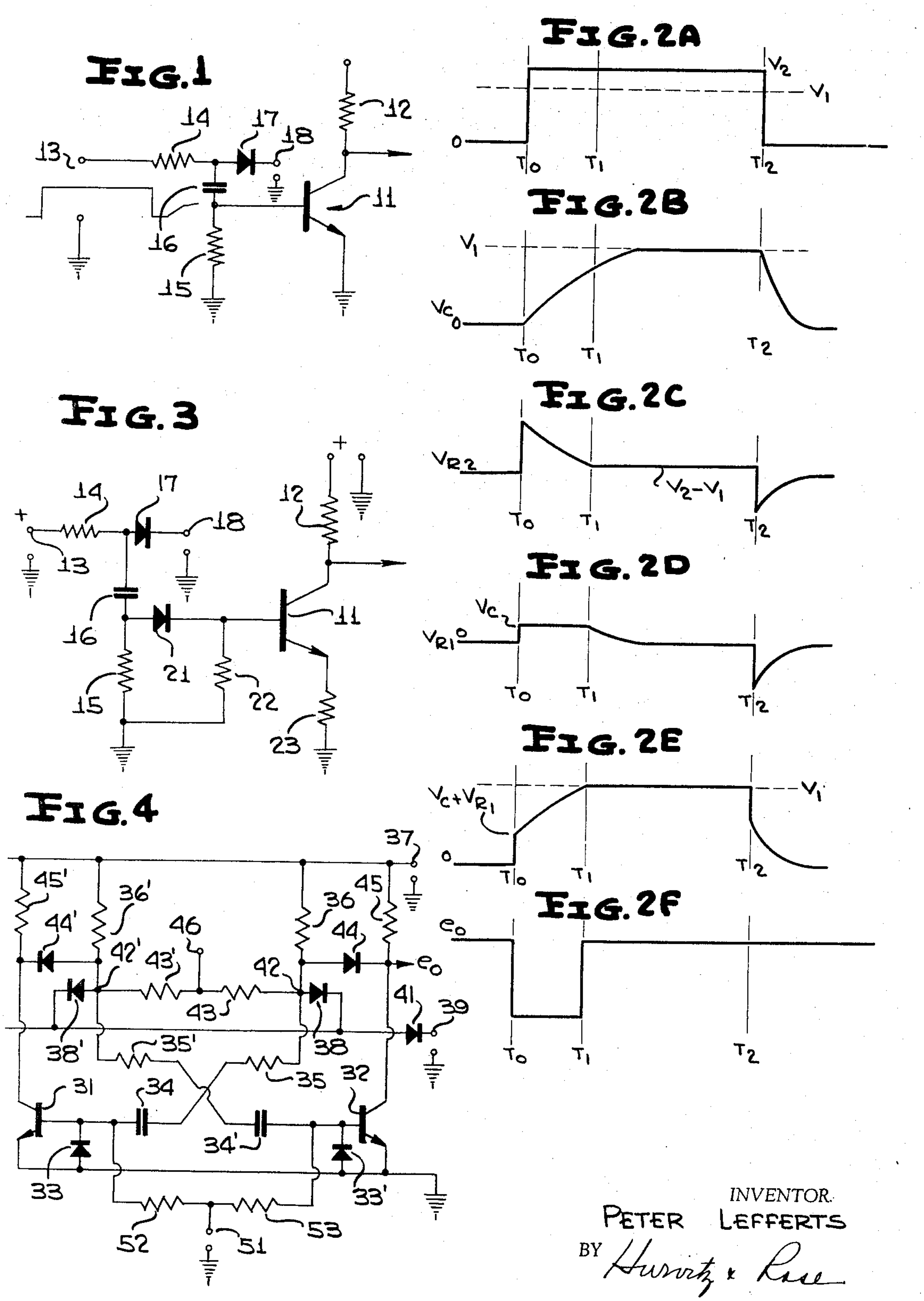
FIGURE 1 is a circuit diagram of a preferred embodiment of the present invention.
FIGURES 2A–2F are waveforms depicting the manner in which the circuit of FIGURE 1 functions.
FIGURE 3 is a modification of the circuit of FIGURE 1.
FIGURE 4 is a schematic diagram of a voltage controlled oscillator employing the concepts of the present invention.

Reference is now made to FIGURE 1 of the drawings wherein the reference numeral 11 denotes an NPN type transistor having its emitter connected directly to ground and its collector connected to a positive biasing source through load resistor 12. An input signal is applied to the base of transistor 11 from input terminals 13 via the series circuit which includes resistors 14 and 15, between which is connected to capacitor 16. Connected to the junction of capacitor 16 and resistor 14, is the anode of diode 17, having its cathode connected to a positive voltage source having a value $V_1$ at terminal 18.

The manner in which FIGURE 1 functions to provide a delayed output is seen by considering FIGURES 2A–2F. A rectangular voltage having a zero base and a maximum amplitude excursion $V_2$, in excess of $V_1$, is applied to input terminals 13, as depicted in FIGURE 2A. At the time the leading edge of the wave form of FIGURE 2A is applied to terminals 13, $T_0$, it is assumed that capacitor 16 has zero voltage across it. Consequently the sudden increase in voltage at terminal 13 is divided between resistors 14 and 15. However, because resistor 15 is shunted by the base-emitter diode of transistor 11, the voltage across resistor 15 is clamped to a predetermined level $V_c$. The waveforms for the voltages across resistances 14 and 15 are shown in FIGURES 2C and 2D, respectively.

As time progresses, the voltage across capacitor 16 increases exponentially at a rate determined by the R.C. time constant of resistors 14 and 15 and capacitor 16. The exponential increase across capacitor 16 is towards $V_2$. Concurrently, the voltage across resistor 14 decreases exponentially towards zero. The voltage at the anode of diode 17, the sum of the voltages across resistor 15 and capacitor 16, as illustrated in FIGURE 2E, thus approaches $V_2$ as time progresses. The summation voltage, however, reaches the value $V_1$, the bias voltage connected to terminal 18 at time $T_1$, prior to attainment of its maximum possible voltage, $V_2$. When this occurs, diode 17 conducts heavily and functions substantially as a switch to apply the voltage at terminal 18 to the junction between resistor 14 and capacitor 16. This prevents the further flow of current through the series circuit of capacitor 16 and resistor 15, hence the base to emitter voltage of transistor 11 rapidly drops to zero.

The conduction of current through the collector-emitter path of transistor 11 which was established by the initial large voltage across resistor 15 at time $T_0$ is thus terminated at time $T_1$. This results in the rectangular wave output at the collector electrode of transistor 11, as depicted in FIGURE 2F.

At time $T_1$, when conduction through transistor 11 ceases, the voltage across capacitor 16 charges to the value $V_1$, to satisfy Kirchoff's voltage law. At the same time the voltage decrease across resistor 14 is terminated because constant current then begins to flow through it. The voltages across resistances 14 and 15 and capacitor 16 remain constant through the remainder of the rectangular wave's positive portion, from $T_1$ to $T_2$.

At time $T_2$, when the voltage at terminal 13 returns to its zero base level, the voltages across resistors 14 and 15 suddenly go negative and the voltage across capacitor 16 begins an exponential decrease towards zero. Since the voltage at the base of transistor 11 goes negative and the transistor is already cut off, the trailing edge of the input has no effect on the transistor's conductivity and its output voltage, as seen by inspection of FIGURE 2F.

It should now be apparent that the delay time, $T_0$–$T_1$, may be controlled by varying resistors 14 or 15, capacitor 16, or the value of the voltage at terminal 18. This permits the present circuit to have considerable versatility, particularly as a voltage controlled delay element. The present circuit has the further advantage of a favorable situation with regard to transistor leakage. It operates accurately with a charging current of only about twice the expected leakage of transistor 11 if, as is usually the case, the leakage of diode 17 is about an order of magnitude less than that of the transistor. This is in distinction to the conventional delay circuits with which I am familiar, wherein an isolating diode introduces deleterious effects with variations in temperature because its junction drop adds with that of the transistor base-emitter, instead of subtracting, and timing hence becomes considerably more indefinite.

For purpose of variable finite to zero time delays, the present invention functions admirably but with a reduction in temperature compensation when voltage drop diode 21 is utilized, as seen in the circuit of FIGURE 3. The circuit of FIGURE 3 is substantially like that of FIGURE 1 but includes diode 21 connected between the base of NPN transistor 11 and the junction of resistor 15 with the capacitor 16. Connected directly to the cathode of diode 21 and the base of transistor 11 is base load resistor 22, which develops the input voltage for transistor 11 between its base and ground. A small amount of degenerative feedback is obtained in the circuit of FIGURE 3 by connecting resistor 23 between the emitter of transistor 11 and ground.

The circuit of FIGURE 3, in addition to biasing the base of transistor 11 compared to the input terminal 13, is admirably suited for deriving variable delays, over large ranges. Such delays, which may vary between zero and considerably large finite times, are controlled in response to the voltage magnitude at terminal 18. If the voltage at terminal 18 is reduced to zero, an extremely short duration, low amplitude positive pulse is applied to the base electrode of transistor 11 in response to the leading edge of the wave form of FIGURE 2A. This pulse is of such low magnitude that it is not coupled to the base of transistor 11. This is because the forward voltage drop of diode 21 prevents the flow of enough current to the transistor base to preclude conduction through the transistor. Hence, there is no voltage change developed across resistor 12 and the voltage at the collector of transistor 11 never decreases from that of the positive biasing source connected to resistance 12. A further function of diode 21 is isolation of the transistor base from large reverse voltages which occur when an input pulse returns to zero. Diodes in many cases can survive a much greater reverse voltage than a transistor base emitter junction without breaking down.

Reference is now made to FIGURE 4 of the drawings, a schematic diagram of a multi-vibrator type voltage controlled square wave oscillator embodying the principles of the present invention. The oscillator of FIGURE 4 includes a pair of NPN transistors 31 and 32 having symmetrically arranged control circuits. The base to emitter control circuit of transistor 31, shunted by protective diode 33, includes capacitor 34, connected in series with resistors 35 and 36, the latter having one of its terminals connected to a positive biasing source connected to terminal 37. The other terminal of resistor 36 is connected to the anode of diode 38, the cathode of which is connected to positive biasing terminal 39 via diode 41. The voltage at terminal 39 must be less than that at terminal 37, for reasons seen infra.

Connected to the anode of diode 38 at junction 42 are resistor 43 and the anode of isolating diode 44. A positive analog input signal is applied to resistor 43 via terminal 46 to control the periodicity of the oscillator. The cathode of isolating diode 44 is connected to resistor 45 which is connected between the collector of transistor 32 and positive biasing terminal 37. To insure complete cut off of transistors 31 and 32 during the portion of the cycle when they are not conducting, a negative biasing voltage is connected thereto from terminal 51 via resistors 52 and 53.

The control circuit for transistor 32 is identical with the one for transistor 31 and the components associated with this control circuit are designated with the same reference numerals as those for transistor 31, with the exception of prime connotations.

To describe the operation of the circuit of FIGURE 4, it is assumed that transistor 32 is conducting while transistor 31 is cut off. In consequence, the collector voltage of transistor 32 is low and a current path exists from terminal 37 through resistor 36 and diode 44 to the collector of transistor 32. This path is established since the anode of diode 44 is at a more positive voltage than its cathode and thus is in conduction. Another current path is established from terminal 37 through resistances 36' and 35' and the base emitter junction of transistor 32 to charge capacitor 34' thus maintaining transistor 32 in a conducting state.

When the voltage at point 42' reaches the voltage on the anode of diode 41, as determined by the magnitude of the signal at terminal 46 and the charge across capacitor 34', the flow of current to the base of transistor 32 is terminated and this transistor becomes cut off. In response to cut off of transistor 32, the voltage at point 42 suddenly increases due to the decreased current through resistance 36. The voltage increase at terminal 42 results in a positive current being coupled to the base of transistor 31 which forces it into conduction. Conduction of transistor 31 results in a voltage drop across resistors 36' and 45' and forward biasing of diode 44', into its conduction. Hence, a drop in the voltage at terminal 42' occurs and discharge of capacitor 34' commences, as indicated in FIGURE 2B. Capacitor 34' is discharged sufficiently to enable it to be recharged in response to a further cycle of operation when transistor 31 is again cut off and transistor 32 becomes conductive.

Conduction through transistor 31 proceeds from the initial time in each cycle to some subsequent time as determined by the voltage at input signal terminal 46, the values of resistances 35, 36, and 43 and capacitor 34. When the voltage at terminal 42 reaches that at the anode of diode 41, cessation of current through capacitor 34 occurs due to the limiting action of diode 38. This cuts off transistor 31 causing an increase in the voltage at terminal 42'. This once more causes current to flow into the base of transistor 32 and render it conductive. It should thus be apparent that this cycle is repeated continuously under the predominant control of the amplitude of the signal at terminal 46.

An output voltage may be obtained at any convenient point, such as the collector of transistor 32 to provide square waves having the controlled frequency. The voltage controlled oscillator of FIGURE 4 provides an extremely stable output. In one model actually fabricated, the frequency deviated by 0.05% for a four hour time period.

Figure 5:
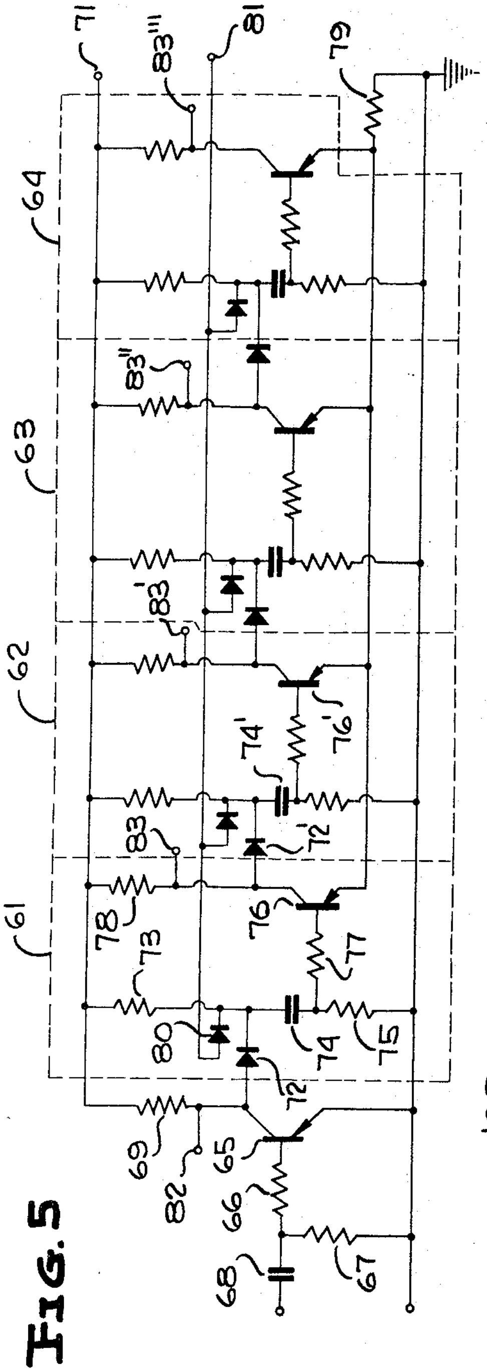
FIGURE 5 is a schematic diagram of a pulse delay line embodying the concepts of the present invention.

Reference is now made to FIGURE 5 of the drawings which discloses a pulse delay line incorporating four identical pulse delay sections 61–64. Each of the pulse delay sections 61–64 is arranged so that a positive output voltage is sequentially derived at its output terminal.

The first pulse delay section 61 is responsive to the output of a pulse shaping network including PNP type transistor 65. Connected between the emitter-base electrodes of transistor 65 are resistors 66 and 67, whose junction is connected to one terminal of capacitor 68. The other terminal of capacitor 68 is responsive to a periodic pulse source having positive and negative going wave segments. The collector of transistor 65 is connected through load resistance 69 to biasing terminal 71, connected to a suitable source of negative energizing potential.

The output of transistor 65 and its collector electrode are coupled via diode 72 to the junction between resistor 73 and capacitor 74. Resistors 73 and 75 and capacitor 74 are connected between negative bias terminal 71 and ground to form the charging circuit of the present figure. The voltage of the charging circuit is limited by biased diode 80, having its cathode connected to the junction of capacitor 74 with resistor 73 and its anode connected to the negative voltage at terminal 81.

The output voltage of the charging circuit, at the junction between capacitor 74 and resistance 75 is coupled to the base of PNP transistor 76 via current limiting resistor 77. The collector of transistor 76 is connected to biasing terminal 71 via load resistance 78 while its emitter is connected to ground through resistance 79, common to the emitters of every stage so that emitter coupled regeneration occurs to sharpen the resulting pulses. Since each of the stages 62, 63 and 64 is of identical construction with that of stage 61, a complete description of all stages is unnecessary.

In describing the operation of the present invention transistor 65 is normally conducting due to the leakage current through its base which establishes a negative bias to maintain the transistor in a normally conducting state. Hence, the anode of diode 72 is maintained at a more positive potential than its cathode and the voltage across capacitor 74 is approximately equal to the collector-emitter voltage of transistor 65, substantially zero.

In response to a positive pulse coupled between one terminal of capacitor 68 and ground, transistor 65 is cut off and a negative output pulse is immediately derived at its collector electrode, output terminal 82. In response to the increased voltage amplitude at the collector of transistor 65, conduction through diode 72 ceases and the voltage magnitude at its cathode suddenly increases. This is because diode 72 and transistor 65 are no longer holding it to a substantially ground potential. Hence, the voltage at the base of transistor 76 suddenly becomes negative and conduction through the transistor collector-emitter path begins.

Concurrently, the voltage across capacitor 74 starts to increase due to the flow of current through it. The voltage across capacitor 74 continues to increase until the voltages at the cathode and anode of diode 80 are equal. At this time, conduction through capacitor 74 and resistance 75 ceases and the voltage at the base of transistor 76 drops to zero, effecting cut off and the cessation of collector current.

It is to be understood that for the foregoing operation to proceed, the voltage applied to the anode of diode 72 must be maintained at a large negative amplitude for a time period until non-conduction of current through condenser 74 and 75 occurs. To attain this effect it is necessary for resistor 67 and capacitor 68 in the base to emitter network of transistor 65 to have a relatively long time constant.

In response to conduction through transistor 76, its collector electrode is driven to a lower amplitude negative voltage, hence more positively. In consequence, a positive going wave front is derived at output terminal 83 simultaneously with the positive going wave front applied between one terminal of capacitor 68 and ground and a positive wave is derived at terminal 83 for the full duration of the conduction of transistor 76. This positive going wave is coupled through diode 72' in section 62 to reduce the voltage amplitude on capacitor 74' in the second stage. It has no effect on the conduction of the second stage transistor 76' since the latter is already maintained at cut off and the positive voltage has a tendency to drive it more severely into this region. However, when conduction through transistor 76 ceases and the voltage magnitude at the junction between diode 72' and capacitor 74' increases, hence goes more negative, a negative voltage is applied to the base of transistor 76' and it is rendered conductive.

The same cycle of operation now occurs for transistor 76' and the components associated therewith in stage 62 as described in connection with stage 61. Hence, at terminal 83' a positive going output voltage is derived having its leading edge occurring at approximately the same time as the trailing edge of the voltage pulse derived at terminal 83.

It should now be apparent that sequential pulses are derived at each of the output terminals 83'' and 83''' of stages 63 and 64 in substantially the same manner as that described for the first and second stages 61 and 62. It should also be apparent that the relative time delay introduced between the outputs of the various stages may be modified merely by appropriately designing the component values in each of the timing circuits including resistors 73 and 75 and capacitors 74.

Figure 6:
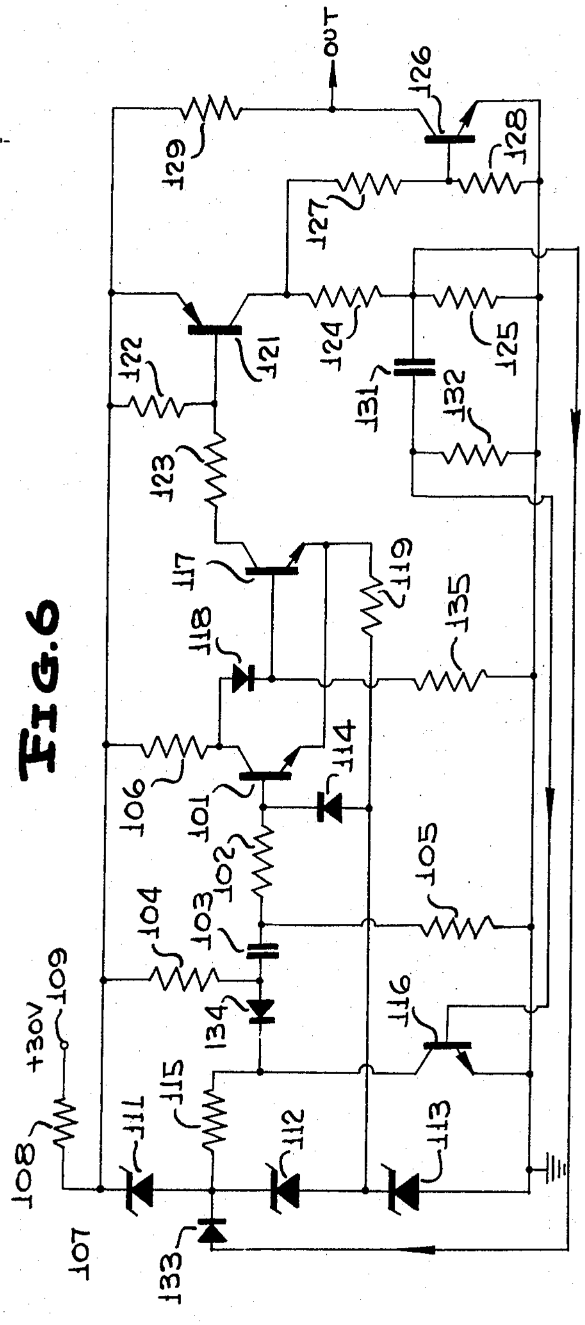
FIGURE 6 is a schematic diagram of a low frequency clock source utilizing the concepts of the present invention.

Reference is now made to FIGURE 6 of the drawings upon which is illustrated a clock source or oscillator, designed particularly for extremely low frequencies. The circuit of FIGURE 6 includes the basic timing configuration of the present invention including NPN transistor 101 having its base connected to current limiting resistor 102 which is series connected to the timing combination of capacitor 103 and resistance 104. Connected between the junction of capacitor 103 and resistor 102 is one terminal of bias resistance 105, the other terminal of which is connected to ground. The collector of transistor 101 is connected via load resistance 106 to a well-regulated source of supply at terminal 107, as is resistance 104.

Regulation at terminal 107 is achieved by connecting a current limiting resistor 108 to a positive source of D.C. potential at terminal 109 and connecting three Zener diodes 111–113 in series between terminal 107 and ground. To provide good regulation for the base of transistor 101, the junction between Zener diodes 112 and 113 is connected to it via protective diode 114, which obviates the deleterious effects of back biasing on the transistor base electrode. A well-regulated source of potential, having a voltage less than at terminal 107, is coupled to diode 134 from the junction of Zener diodes 111 and 112 via resistance 115. The junction between the cathode of diode 134 and resistance 115 is connected to the collector of switching transistor 116, the emitter of which is grounded.

The output gain of transistor 101 is enhanced by being coupled with transistor NPN 117 in a regenerative network. This is established by connecting the collector of transistor 101 to the base of transistor 117 via diode 118 and tying the emitters of these transistors together. The emitters of transistors 101 and 117 are provided with a small degree of regeneration by common emitter resistance 119, connected to the stabilized voltage between Zener diodes 112 and 113. The base of transistor 117 is stabilized against leakage currents through its connection to biasing resistor 135.

Output is coupled from the collector of transistor 117 to the base of PNP type transistor 121 via the voltage divider network including resistances 122 and 123 which are connected in series between terminal 107 and the collector electrode of transistor 117. Biasing for transistor 121 is established by connecting its emitter directly to terminal 107 and its collector to ground via series resistances 124 and 125.

The output of transistor 121, at its collector electrode, is fed via a D.C. path to the base of NPN transistor 126 by resistances 127 and 128, the latter of which is connected between the base of transistor 126 and ground. The collector of transistor 126 is connected to terminal 107 by load resistance 129 so that an output voltage is derived at this point.

To control switching of transistor 116 in response to the output signal of transistor 121, a second timing circuit of considerably shorter duration is provided. Resistor 124 and capacitor 131 provide the timing function and diode 133 limits the charging of capacitor 131 to a definite value. Resistor 125 provides a connection to ground for the collector circuit of transistor 121, and resistor 132 provides a bias connection between the base and emitter of transistor 116.

To describe the operation of the circuit of FIGURE 6, it is assumed that the positive biasing voltage connected to terminal 109 has just been switched on, and capacitor 103 is not charged. Hence, the input voltage at the base of transistor 101 immediately jumps to a positive value and the transistor conducts heavily.

As time progresses, charge is built up on capacitor 103 until the voltage at the junction of capacitor 103 and diode 134 reaches the voltage at the cathode of diode 134. At this time, conduction through capacitor 103 ceases and transistor 101 is driven to cut off. This results in a sudden increase in the voltage at the collector of transistor 101 and a decrease in the voltage at its emitter. These two voltages are combined at the base and emitter of transistor 117 so that conduction of the latter increases and a decrease in the voltage at the base of transistor 121 occurs. The decreased voltage at the base of transistor 121 is accompanied by an increase in its conductivity and a rise in potential at its output or collector electrode. This rise in potential is amplified by transistor 126 which derives a negative going output level.

At the same time, an increase in the voltage level applied to the timing circuit including capacitor 131, diode 133, and resistance 124 occurs. The timing circuit as described previously shapes this voltage change into a short duration square wave which renders transistor 116 highly conductive. This pulse is of sufficient magnitude to provide a substantially zero impedance path for the charge accumulated on capacitor 103 so that the latter is reverse charged to a voltage level governed by the potential between diode 113 and ground. The junction between capacitor 103 and diode 134 is thus lowered to a potential near ground level. The pulse from the timer network 131 and 124 disappears rapidly and the cycle is reinstituted. All succeeding cycles will now run at a longer stable time since cycle capacitor 103 now starts with a reverse charge.

Since the charge on capacitor 103 is reduced rapidly, transistor 101 is rendered in a conducting state soon after it was previously cut off. This reduces the input current to transistor 117 due to the lack of conduction through diode 118 so that the voltage applied to transistor 121 goes positive. This voltage increase at the base electrode of transistor 121 is reflected as a negative going input to amplifying transistor 126. In consequence, the output voltage derived at the collector of transistor 126 returns to a large value. The negative voltage level at the output of transistor 121 is coupled through capacitor 131 but has no effect on previously cut off transistor 116. Hence, a new cycle of operation is initiated.

It should now be apparent that the same sequence of operation occurs for each pulse in the oscillator. It has been found that the reset time for the oscillator disclosed in FIGURE 6 is approximately 0.16% of the total operating cycle and that drift is at low as 0.1% for temperatures less than 55° C. It is possible with the clock circuit disclosed in FIGURE 6 to achieve a timing period up to 70 seconds by utilizing a four microfarad Mylar capacitor for condenser 103 and by selecting resistances 104 and 105 to have values of 18.2 megohms and 51 megohms.

While I have described and illustrated one specific embodiment of my invention, it will be clear that variations of the details of construction which are specifically illustrated and described may be resorted to without departing from the true spirit and scope of the invention as defined in the appended claims.

What is claimed is:

1. A timing circuit operative to generate a timing pulse of predetermined length in response to an input pulse of longer than said predetermined length comprising:

an input terminal to which said input pulse of longer length than said timing pulse is applied;

a current limiting resistance;

a clamping diode;

a source of clamping voltage;

means connecting said input terminal, said current limiting resistance, said clamping diode and said source of clamping voltage in a series circuit in the order stated, said diode being poled to be conductive of said input pulse, said source of clamping voltage being poled to bias said clamping diode into non-conductive state, and said input pulse having a greater amplitude than said clamping voltage;

a switching device having two stable states and a control terminal, said switching device being responsive to current flowing to said control terminal for changing its state;

a capacitor;

means connecting the junction of said current limiting resistance and said diode to said control terminal via said capacitor so that the state of said switching device is controlled by the current through said capacitor; and an output terminal for said switching device.

2. The timing circuit of claim 1 wherein said switching device comprises: a transistor having a base, a grounded emitter and a collector; and a load connected to said collector, said base being connected to said control terminal, and said output terminal being connected to said collector.

3. The switching circuit of claim 2 further comprising an additional resistance connected between said base and ground to provide a load for the switching transistor input.

4. The timing circuit of claim 1 wherein said capacitor charges exponentially toward the voltage of said input pulse and wherein said diode clamps the voltage across said capacitor to the voltage of said source when the capacitor charges to the voltage of said source, and wherein said current limiting resistance is variable to control the length of said output pulse.

5. The switching circuit of claim 1 wherein said capacitor charges exponentially toward the voltage of said input pulse and wherein said diode clamps the voltage across said capacitor to the voltage of said source when the capacitor charges to the voltage of said source and wherein said capacitor is variable to control the length of said output pulse.

6. The switching circuit of claim 1 wherein said capacitor charges exponentially toward the voltage of said input pulse and wherein said diode clamps the voltage across said capacitor to the voltage of said source when the capacitor charges to the voltage of said source and wherein said source of clamping voltage is variable to control the length of said output pulse.

7. A timing circuit operative to generate a timing pulse of predetermined length in response to an input pulse of longer than said predetermined length comprising:

a capacitor having a first terminal and a second terminal;

a resistive charging circuit;

means connecting said resistive charging circuit in series with said first terminal;

a current sensitive device;

means connecting said current sensitive device in series with said second terminal;

means applying said input pulse of longer length than said timing pulse in series with said resistive charging circuit to said capacitor and via said capacitor to sad current sensing device;

a clamping circuit for clamping the voltage across said capacitor when said voltage attains a predetermined level below the level of said input pulse;

means connecting said clamping circuit to said first terminal; and means responsive to said current sensitive device for generating said timing pulse.

References Cited

UNITED STATES PATENTS

| | | | |
|---|---|---|---|
| 2,876,365 | 3/1959 | Slusser | 307—88.5–9.3 |
| 2,906,870 | 9/1959 | Huntley et al. | 328—106 |
| 2,907,955 | 10/1959 | Beck | 331—177 |
| 2,933,625 | 4/1960 | Tounsend et al. | 307—88.5 |
| 2,936,428 | 5/1960 | Schweitzer | 331—177 |
| 2,946,899 | 7/1960 | Day | 307—88.5 |
| 3,033,994 | 5/1962 | Fujimoto et al. | 307—88.5 |
| 3,119,027 | 1/1964 | Faust | 307—88.5 |
| 3,125,692 | 3/1964 | Fennick et al. | 307—88.5–9.3 XR |
| 3,130,327 | 4/1964 | Krossa et al. | 307—88.5 |
| 3,139,534 | 6/1964 | Freeborn | 307—88.5–6 XR |
| 3,158,822 | 11/1964 | Brechling | 331—111 |
| 3,165,648 | 1/1965 | Sainsbury | 307—88.5–6 XR |
| 3,167,724 | 1/1965 | Vallese | 331—111 |
| 3,173,025 | 3/1965 | Davidson | 307—88.5 |

FOREIGN PATENTS

| | | |
|---|---|---|
| 1,062,532 | 4/1954 | France. |

ARTHUR GAUSS, *Primary Examiner.*

D. D. FORRER, *Examiner.*